US012588313B2

(12) United States Patent
Henry et al.

(10) Patent No.: US 12,588,313 B2
(45) Date of Patent: Mar. 24, 2026

(54) METHOD FOR COLLECTIVE BENDING OF MICROELECTRONIC COMPONENTS INCLUDING A TRANSFER THE MICROELECTRONIC COMPONENTS THEN ASSEMBLED TO A TEMPORARY HANDLE

(71) Applicant: COMMISSARIAT A L'ENERGIE ATOMIQUE ET AUX ENERGIES ALTERNATIVES, Paris (FR)

(72) Inventors: David Henry, Grenoble Cedex (FR); Alexis Rochas, Grenoble Cedex (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 481 days.

(21) Appl. No.: 18/256,517

(22) PCT Filed: Dec. 20, 2021

(86) PCT No.: PCT/EP2021/086756
§ 371 (c)(1),
(2) Date: Jun. 8, 2023

(87) PCT Pub. No.: WO2022/136253
PCT Pub. Date: Jun. 30, 2022

(65) Prior Publication Data
US 2024/0021744 A1      Jan. 18, 2024

(30) Foreign Application Priority Data

Dec. 22, 2020     (FR) ..................................... 20 13969

(51) Int. Cl.
*H10F 77/14*         (2025.01)
*H10F 39/00*         (2025.01)
(Continued)

(52) U.S. Cl.
CPC ......... *H10F 77/147* (2025.01); *H10F 39/026* (2025.01); *H10F 71/139* (2025.01);
(Continued)

(58) Field of Classification Search
CPC .... H10F 77/147; H10F 39/026; H10F 71/139; H10F 77/50; H10F 39/80; H10F 39/804;
(Continued)

(56) References Cited

U.S. PATENT DOCUMENTS 11,908,832 B2 *   2/2024   Rochas ................... H01L 24/97
2009/0115875 A1   5/2009   Choi et al.
(Continued)

FOREIGN PATENT DOCUMENTS

JP          2020-109821 A      7/2020

OTHER PUBLICATIONS

International Search Report and Written Opinion issued Apr. 25, 2022 in PCT/EP2021/086756 filed on Dec. 20, 2021, 12 pages.
Chambion et al., "Collective curved CMOS sensor process: application for high-resolution optical design and assembly challenges", 2019 IEEE 69th Electronic Components and Technology Conference (ECTC), IEEE, 2019, pp. 535-542.
Wu et al., "Fabrication Techniques for Curved Electronics on Arbitrary Surfaces", Advanced Materials Technologies, vol. 5, No. 8, 2020, pp. 1-29.

*Primary Examiner* — Matthew L Reames
(74) *Attorney, Agent, or Firm* — Oblon, McClelland, Maier & Neustadt, L.L.P.

(57) ABSTRACT
A method for collective bending of microelectronic components, including affixing an initial structure including a temporary handle and a plurality of microelectronic components, onto a shaping support, then removing the temporary handle, and bending the microelectronic components so that they are curved and adhere, by an adhesive layer, to the bent surfaces of the shaping support.

14 Claims, 9 Drawing Sheets

(51) Int. Cl.
    *H10F 71/00*       (2025.01)
    *H10F 77/50*       (2025.01)
    *H10H 20/01*       (2025.01)
    *H10H 20/855*     (2025.01)

(52) U.S. Cl.
    CPC ........... *H10F 77/50* (2025.01); *H10H 20/855*
          (2025.01); *H10H 20/036* (2025.01)

(58) Field of Classification Search
    CPC .... H10F 39/806; H10F 77/407; H10F 77/933;
                                  H10H 20/855
    See application file for complete search history.

(56)                    References Cited

U.S. PATENT DOCUMENTS

| | | |
|---|---|---|
| 2018/0145106 A1 | 5/2018 | Yang et al. |
| 2018/0145107 A1 | 5/2018 | Yang et al. |
| 2019/0140008 A1 | 5/2019 | Chambion et al. |
| 2020/0185444 A1 | 6/2020 | Chiang et al. |
| 2021/0151491 A1 | 5/2021 | Chiang et al. |
| 2022/0102310 A1 | 3/2022 | Sato et al. |

* cited by examiner

Z
Y ⊗ X

METHOD FOR COLLECTIVE BENDING OF MICROELECTRONIC COMPONENTS INCLUDING A TRANSFER THE MICROELECTRONIC COMPONENTS THEN ASSEMBLED TO A TEMPORARY HANDLE

TECHNICAL FIELD

The field of the invention is that of methods for collective bending and packaging of microelectronic components, and in particular that of methods implemented "at the semiconductor wafer level" (WLP standing for Wafer-Level Packaging), and even that of methods of the WLCSP type (standing for Wafer-level Chip-Scale Packaging), i.e. the final structure formed by the microelectronic component and its electrical interconnection support may have lateral dimensions of the same order of magnitude as those of the microelectronic component.

PRIOR ART

It might be desirable to have microelectronic components, and in particular optoelectronic components, having a predefined curvature with respect to a reference plane. This is particularly the case when it comes to optical components for detecting or emitting a light radiation, whose curvature allows improving their optical performances, for example by compensating for the curvature of the field or by correcting astigmatism at least partially. In the case of optical components in emission, the curvature could facilitate shaping of the emitted light radiation.

Making and packaging of such microelectronic components may be performed at the wafer scale, i.e. from the same semiconductor wafer including a plurality of identical integrated circuits each intended to form one of the microelectronic components. The packaging consists of all steps of assembling each microelectronic component in a case or a support allowing establishing its electrical connection to an external electrical circuit, and possibly improving its performances (thermal management, mechanical protection, reliability . . . ).

The document US2009/0115875A1 describes an example of a method for collective bending of microelectronic components, herein optical components, on a shaping and electrical interconnection support. First of all, the microelectronic components are made from the same functionalised substrate. They are coated with an upper support layer made of a flexible and transparent polymeric material, and by a lower support layer made of another polymeric material. Afterwards, they are individualized by cutting (dicing), then are transferred onto the same shaping support. This shaping support has a plurality of bent surfaces (herein concave). It also includes electrical interconnections allowing establishing the electrical connection between the microelectronic components and an external electrical circuit (not represented).

However, it arises that such a bending method might induce a curvature of the microelectronic components that is not that one actually desired.

Moreover, the documents US2019/140008A1, US2020/185444A1, US2018/145107A1, JP2020109821A are also known, and the publication by Chambion et al. entitled *Collective Curved CMOS Sensor Process: Application for High-Resolution Optical Design and Assembly Challenges,* 69th Electronic Components and Technology Conference, p. 535-542, 2019.

DISCLOSURE OF THE INVENTION

An objective of the invention is to overcome at least part the drawbacks of the prior art, and more particularly to provide a method for collective bending of microelectronic components which allows obtaining an effective curvature of the microelectronic components as close as possible of the desired curvature.

For this purpose, the object of the invention is a method for collective bending of microelectronic components including the following steps:

making an initial structure, including: a plurality of microelectronic components, having an upper face and an opposite lower face, spaced laterally apart from each other by a non-zero distance $l_t$; and a same temporary handle substrate, made of a rigid material, which extends continuously opposite the microelectronic components, and to which all microelectronic components are assembled by their upper face;

providing a shaping support, having an upper face and an opposite lower face, the upper face including a plurality of bent surfaces surrounded by lateral walls;

depositing an adhesive interlayer covering the lower face of the microelectronic components or the upper face of the shaping support;

affixing the initial structure onto the shaping support, so that the microelectronic components rest and adhere at a support area of their lower face over an upper surface of the lateral walls;

removing the temporarily handle substrate;

bending the microelectronic components, so that they are curved, and adhere over the bent surfaces by the adhesive interlayer, the latter then being in contact with the lower face of each microelectronic component and of the corresponding bent surface;

dicing the assembly thus obtained, so as to individualise the microelectronic components, each then being assembled to a portion of the shaping support.

Some preferred yet non-limiting aspects of this method are as follows.

The step of making the initial structure may include the following steps: making a microelectronic substrate, having an upper face and an opposite lower face, including the plurality of microelectronic components; making trenches in the microelectronic substrate, from its upper face, surrounding the microelectronic components, and having a width equal to the distance $l_t$; assembling the microelectronic substrate by its upper face to the temporary handle substrate; thinning the microelectronic substrate from its lower face, until making the trenches open-through.

The method may include, before the removal step, a temperature rise to a first temperature within a crosslinking temperature range of the adhesive interlayer, then, during or after the bending step, a temperature rise to a second temperature within the crosslinking temperature range and higher than the first temperature.

The method may include a prior step of determining a width $l_a$ of the support area, comprised between a predefined minimum value $l_{a,min}$ and a predetermined maximum value $l_{a,max}$, the latter depending on a radius of curvature $R_c$ and lateral dimensions $l_{sc}$ of the bent surfaces, and lateral dimensions $l_{co}$ of the microelectronic components before bending.

The lower face of the microelectronic components may, before the deposition of the adhesive interlayer, be a free face, the adhesive interlayer being deposited so as to have a constant thickness over the lower face of the microelectronic components or over the upper face of the shaping support.

Before the step of removing the temporary handle substrate, the method may include a step of making lower conductive pads are made over the lower face of the microelectronic components, adapted to ensure the electrical connection of the microelectronic components, and disposed over a level line of a lower face of the corresponding microelectronic component, the line level being predetermined as being a line equidistant from the lower face of the shaping support, when the microelectronic component is assembled to the shaping support and is curved according to the curvature of the bent surface.

Before the step of removing the temporary handle substrate, the method may include a step of making upper conductive pads are made over the upper face of the microelectronic components, and conductive vias extending from the lower face of the microelectronic components and opening onto the upper conductive pads, the lower conductive pads being connected to the conductive vias of the microelectronic components.

After the bending step, a second handle substrate may be assembled to the lateral walls of the shaping support, so as to enable handling of the stack thus obtained during a step of making the conductive vias in the shaping support.

After the bending step, the method may include a step of making the conductive vias extending throughout the shaping support and the adhesive interlayer, from the lower face of the shaping support to open onto the lower conductive pads, the conductive vias having a uniform vertical dimension.

The lower conductive pads may be disposed in contact with the conductive vias of the microelectronic components, or may be offset with respect to these conductive vias and are connected by conductive lines.

The adhesive interlayer may completely cover the lower face of the microelectronic components as well as the lower conductive pads, and has a free, planar and continuous lower face.

The shaping substrate may be made into a one-piece block and in the same material.

The shaping substrate may be made of a heat-conductive material.

The microelectronic components may be optical components for emitting or detecting a light radiation.

BRIEF DESCRIPTION OF THE DRAWINGS

Other aspects, aims, advantages and features of the invention will appear better upon reading the following detailed description of preferred embodiments thereof, given as a non-limiting example, and made with reference to the appended drawings, wherein.

DETAILED DISCLOSURE OF PARTICULAR EMBODIMENTS

Figure 1A:
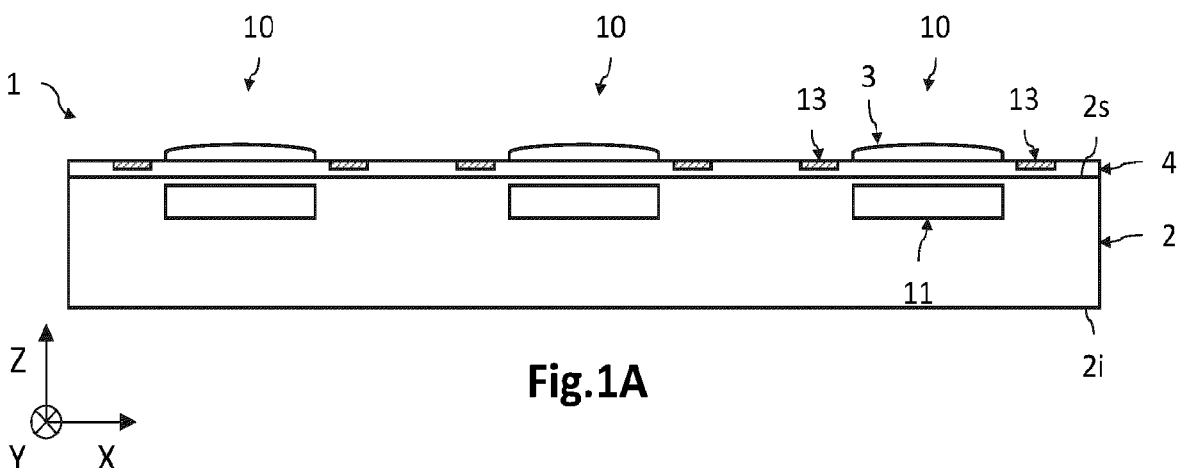
FIGS. 1A to 1M illustrate different steps of an embodiment of a method for collective shaping of microelectronic components, in the case where an adhesive interlayer is deposited over the upper face of the shaping support.

In the figures and in the remainder of the description, the same references represent identical or similar elements. In addition, the various elements are not represented to scale so as to promote clarity of the figures. Moreover, the different embodiments and variants are not mutually exclusive and could be combined together. Unless indicated otherwise, the terms "substantially", "about", "in the range of" mean within a 10% margin, and preferably within a 5% margin. Moreover, the terms "comprised between . . . and . . . " and equivalents mean that the bounds are included, unless stated otherwise.

The invention relates to a method for collective bending of microelectronic components. These are derived from the same functionalised substrate, i.e. they are made according to a WLP approach. Moreover, according to one variant, at the end of the bending method, each set formed by a microelectronic component assembled to its shaping support may have lateral dimensions of the same order of magnitude as that of the microelectronic component itself. Also, the collective bending method may belong to the family of WLCSP type processes.

In the case of the invention, a microelectronic component includes an integrated circuit which may include active microelectronic elements such as transistors or diodes, and/or active optoelectronic elements such as light-emitting diodes or photodetectors. The microelectronic components are made from the same semiconductor substrate (or semiconductor plate, wafer).

In the following description, the microelectronic components are optical components (but they may of course be components of the microwave type, and possibly MEMS components, inter alia). In general, these may be with optical transmission on the front face (FSI, standing for Front Side Illumination) or with optical transmission on the back side (BSI, standing for Back Side Illumination), depending on whether the light radiation of interest crosses, or not, a BEOL (standing for Back End of Line) type interconnection layer of the optical component. However, the terms "FSI" and "BSI" should herein be understood in the broad sense: the optical component may thus be adapted to emit or detect a light radiation of interest. In the examples illustrated later on, the optical components are of the array type (but they may be otherwise), and each includes an array of photodiodes associated with an array of micro-lenses.

FIG. 1A to 1M illustrate different steps of the method for collective bending of microelectronic components 10, herein optical components, on a shaping support. The arrays of photodiodes 11 and of micro-lenses 3 are represented in a simplified manner, that being so to favour the clarity of the figures. In this example, the optical components 10 are therefore of the FSI type, but a BSI configuration is also possible.

An orthogonal three-dimensional direct reference frame XYZ is defined herein and for the following description, where the X and Y axes form a plane parallel to the upper face of an optical substrate 2, and where the Z axis is oriented from the lower face $2i$ to the upper face $2s$ of the latter. In the following description, the terms "lower" and "upper" relate to an increasing positioning according to the direction +Z.

Referring to FIG. 1A, a so-called initial structure 1 including a functionalised semiconductor substrate 2, herein called optical substrate, is made. In this example, the initial structure 1 also includes an array of micro-lenses 3, assembled to the optical substrate 2 by an insulating upper layer 4. The initial structure 1 includes a plurality of optical components 10, intended to be individualised.

The optical substrate 2 has an upper face $2s$ intended herein to receive a light radiation of interest, and an opposite lower face $2i$. It may have an initial thickness in the range of several hundred microns. Its thickness is intended to be reduced to a value for example comprised between 20 μm and 150 μm. In this example, the optical components 10 are CMOS imagers, the optical substrate 2 then being a thick substrate made for example based on silicon. Alternatively, the optical components 10 may be CCD sensors.

Each optical component 10 herein includes an array of photodiodes 11 made for example by localised ion implantation of dopants in the silicon of the optical substrate 2. In this FSI configuration, an interconnection layer (BEOL) is flush with the upper face $2s$. It ensures control or reading (power supply) of the photodiodes 11. Hence, it is intended to be electrically connected to an external electrical circuit (not represented). The interconnection layer includes portions of conductive lines, for example metallic, separated from each other by a dielectric material (for example a silicon oxide and/or nitride, according to the wavelength of the light radiation of interest).

Each optical component 10 herein includes upper conductive pads 13 resting on the upper face $2s$ of the optical substrate 2, connected to the interconnection layer. Also, the electrical connection of the upper conductive pads 13 allows ensuring the different necessary functions (polarisation, power supply, input/output processing, grounding, etc.). Alternatively, as illustrated in FIG. 3A to 3I, the electrical connection of the photodiodes 11 may be performed from the lower face.

An insulating upper layer 4, made of a dielectric material and transparent to the light radiation of interest, covers the upper face $2s$ and contains conductive lines which open onto the pads 13. It consists of an inter-layer dielectric layer (ILD, standing for Inter-Layer Dielectric). The pads 13 may be portions of a conductive line (herein the last conductive line). Of course, other arrangements of the latter are possible. Moreover, the initial structure 1 may also include an array of coloured filters, anti-reflection layers, or any other passive optical element.

Figure 1B:
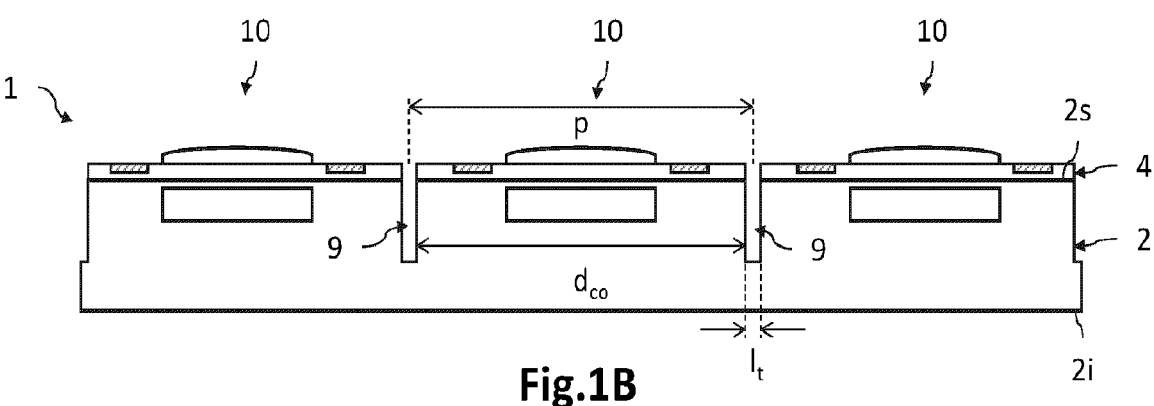

Referring to FIG. 1B, trenches 9 are made in the initial structure 1, so as to pre-individualise the optical components 10, from their upper face. This step may be performed by mechanical sawing or by laser etching, so as to cross the insulating upper layer 4 and to extend along a portion of the thickness of the optical substrate 2. The trenches 9 are non-through indentations which do not open onto the lower face $2i$. The trenches 9 surround the optical components 10 and extend over a depth which defines the final thickness of the optical substrate 2, for example herein over a depth in the range of 20 μm to 150 μm. They have a width $1_t$ in the XY plane and extend longitudinally so as to define the shape of the optical components 10 in the XY plane. This shape may be polygonal, for example square or rectangular, and possibly circular or oval. In this example, the optical components 10 have a square shape in the XY plane with a side $d_{co}$. The trenches 9 are regularly spaced apart from each other by the pitch p.

Figure 1C:
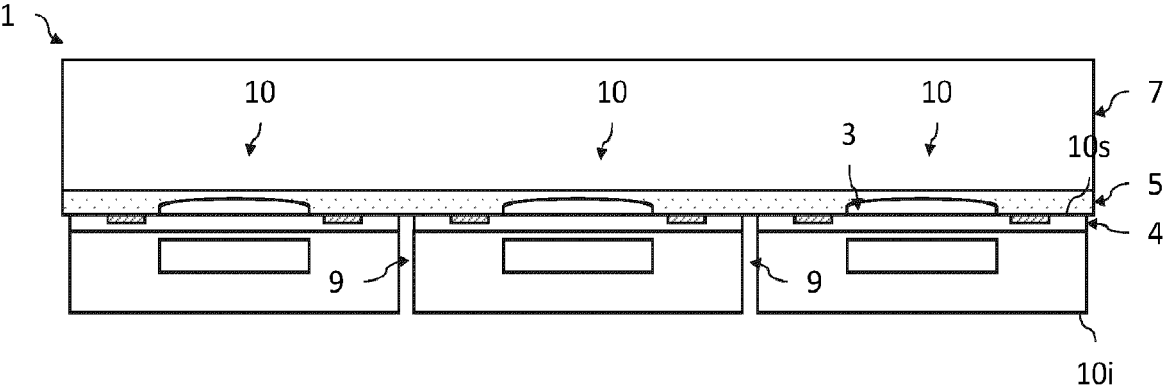

Referring to FIG. 1C, the optical substrate 2 is assembled to a temporary handle substrate 7, on the side of the upper face $2s$. The handle substrate 7 is made of a rigid material, made for example of glass or silicon. By rigid material, it should be understood a material having mechanical properties, and in particular a stiffness, such that the handle substrate 7 does not substantially deform (elastically) with respect to the plane according to which it extends when it is handled. In other words, when the handle substrate 7 is handled, it features substantially no deflection. For example, the handle substrate 7 is made of a material having a Young's modulus comprised between 1 and 400 GPa, and may be glass, a hardened polymer like epoxy, a crystalline material such as silicon, a metallic material, inter alia.

For this purpose, an upper adhesive layer 5 may be deposited, so as to cover the optical substrate 2. In this example, this adhesive layer 5 extends over and in contact with the insulating upper layer 4 and the micro-lenses 3. It has a planar upper face. This adhesive layer 5 is preferably temporary. It may be made of a thermoplastic material, such as the HT1010 material commercialised by Brewer Science. Afterwards, the handle substrate 7 is assembled to the free face of the upper adhesive layer 5.

Afterwards, a thinning of the optical substrate 2 is carried out, starting from its lower face $2i$, for example by mechanical polishing in the presence, or not, of a solution containing abrasive particles, then with a finish by chemical-mechanical polishing, chemical attack, fluorinated plasma etching, or other. The optical substrate 2 then has a final thickness in the range of 20 μm to 150 μm, which enables bending of the optical components 10 while preserving their mechanical properties. The thinning is performed until the trenches 9 are made open-through. Thus, the same structure is obtained in which the optical components 10 are separated and distant from each other by the distance $1_t$, while being all assembled to the handle substrate 7.

Figure 1D:
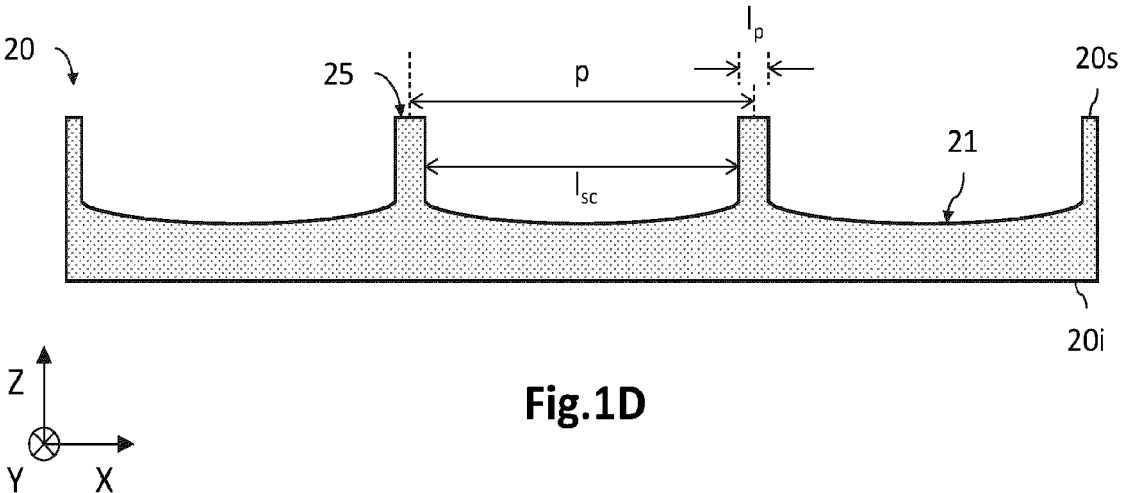

Referring to FIG. 1D, a shaping support 20 is made. It has a planar lower face $20i$ and a structured upper face $20s$. The latter is formed by bent surfaces 21 separated from each other by lateral walls 25. The bent surfaces 21 have, in the XY plane, a lateral dimension $1_{sc}$ smaller than the dimension $d_{co}$, and the lateral walls 25 have a width $1_p$. The bent surfaces 21 are herein concave but they may be convex or have a more complex curvature. They have a uniform radius of curvature $R_c$ from one bent surface 21 to another. They may have circular or oval level lines, or any other shape. A level line of a bent surface 21 is a line equidistant from the lower face $20i$ of the shaping support 20. The lateral walls 25 project opposite the bent surfaces 21, and extend longitudinally around the bent surfaces 21.

The shaping support 20 may be made of the same material, or be formed by several different materials. The material(s) may be electrically insulating or conductive (in the case of FIG. 3, with an insulating layer surrounding the conductive vias 22). The support 20 may be made in one-piece, or be formed by several blocks or thick layers affixed and assembled to each other, for example a planar thick layer topped by a structured layer. In this example, the shaping support 20 is made of the same material, for example silicon, metal, a polymer or other. It may be made of a heat-conductive material to enable a better evacuation of the heat produced by the optical components 10 in operation.

Figure 1E:
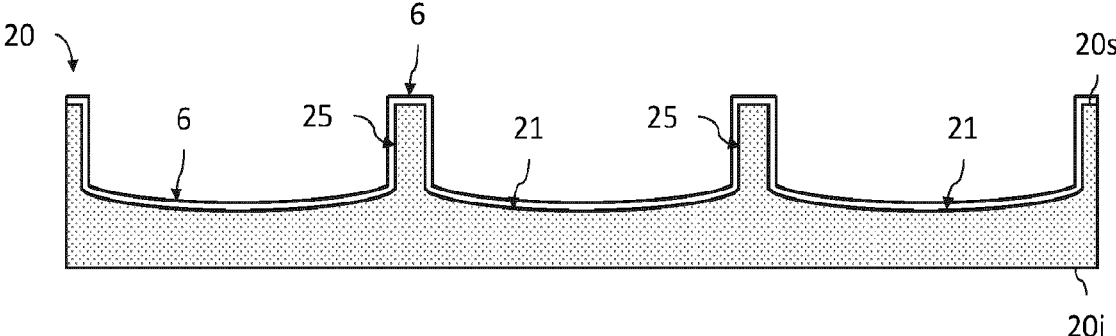

Referring to FIG. 1E, an adhesive interlayer 6 is deposited over the upper face $20s$ of the shaping support 20. It has a uniform thickness over the upper face $20s$, in particular at least over the bent surfaces 21 and over the upper surface of the lateral walls 25. For illustration, the thickness may be comprised between 5 μm and 100 μm, and be for example equal to about 60 μm. As described later on, this adhesive layer 6 may alternatively be deposited so as to cover the lower face $10i$ of the optical components 10 (corresponding to the lower face $2i$ of the optical substrate 2). The adhesive interlayer 6 may be deposited by centrifugation (spin coating), by spray, screen-printing, rolling of a dry film, inter alia.

The adhesive interlayer 6 may be a polymer glue, the crosslinking of which has a wide temperature range, for example comprised between 80° C. and 200° C. Hence, it is possible to proceed with a crosslinking thereof in two steps, i.e. to obtain a first, partial crosslinking, allowing ensuring holding of the optical components 10 on the lateral walls 25 during the step of removing the handle substrate 7 while enabling the subsequent collective bending of these, then performing a second crosslinking, total or almost total, then allowing ensuring holding of the optical components 10 then located at the bent surfaces 21. For example, such glue may be Furukawa AFN-601-60M glue.

Figure 1F:
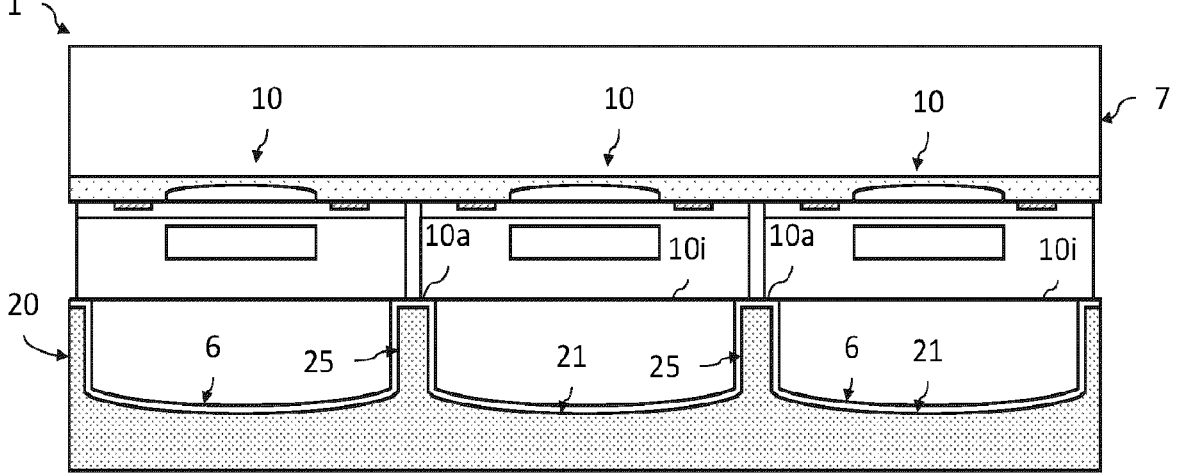

Referring to FIG. 1F, the structure obtained during step 1C is transferred onto the shaping support 20, so that the optical components 10 rest on the lateral walls 25, the adhesive interlayer 6 being located between and in contact with the lower surface of the optical components 10 and the upper surface of the lateral walls 25. More specifically, the optical components 10 rest on the lateral walls 25 at a peripheral area of their lower face 10$i$, defining a support area 10$a$. The width of this support area 10$a$, for each optical component 10, is equal to half the difference between the width $l_p$ of the lateral walls 25 and the width $l_t$ of the trenches 9: i.e. $(l_p-l_t)/2$.

Figure 1G:
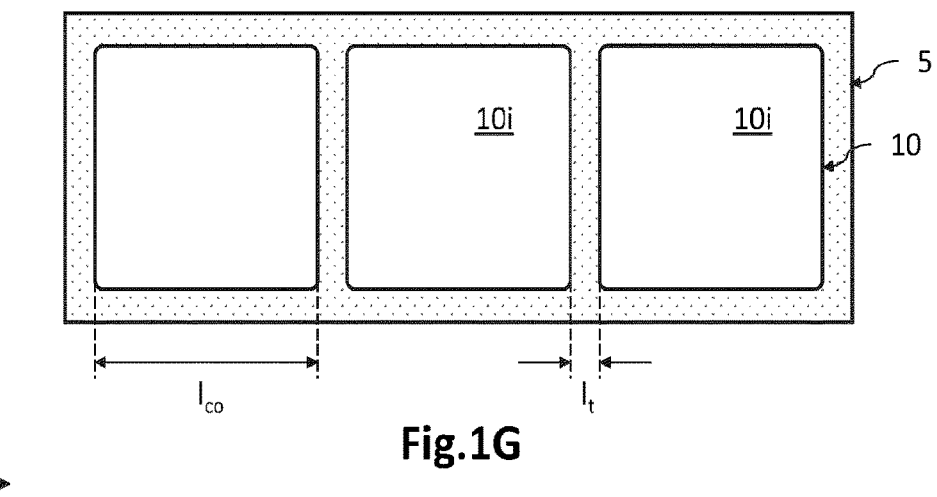

FIG. 1G illustrates the lower face 10$i$ of the optical components 10, separated from each other by the distance lt, and of the upper adhesive layer 5. In this example, the optical components have a square shape in the plane XY, with a side lco.

Figure 1H:
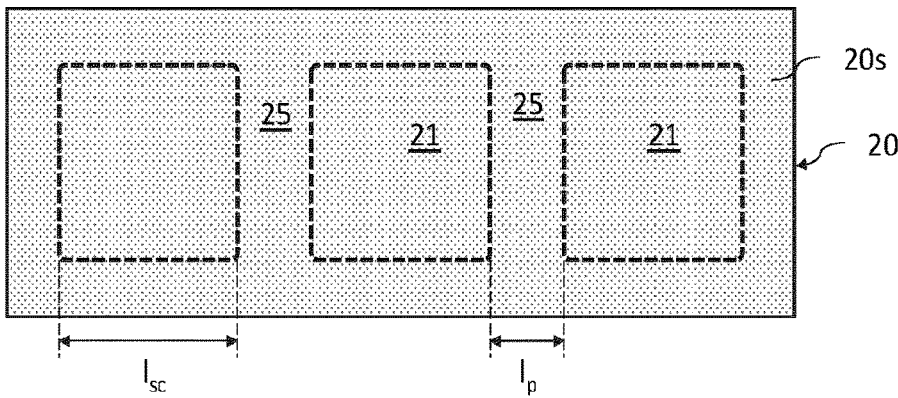

FIG. 1H illustrates the upper face 20$s$ of the shaping support 20. In this example, the bent surfaces 21 have a square shape in the plane XY with a side lsc, and a radius of curvature Rc measured herein along the X and Y axes. The side $l_{sc}$ is smaller than the side $l_{co}$. In addition, the lateral walls 25 have a width $l_p$ larger than the width $l_t$ of the trenches 9.

Figure 1I:
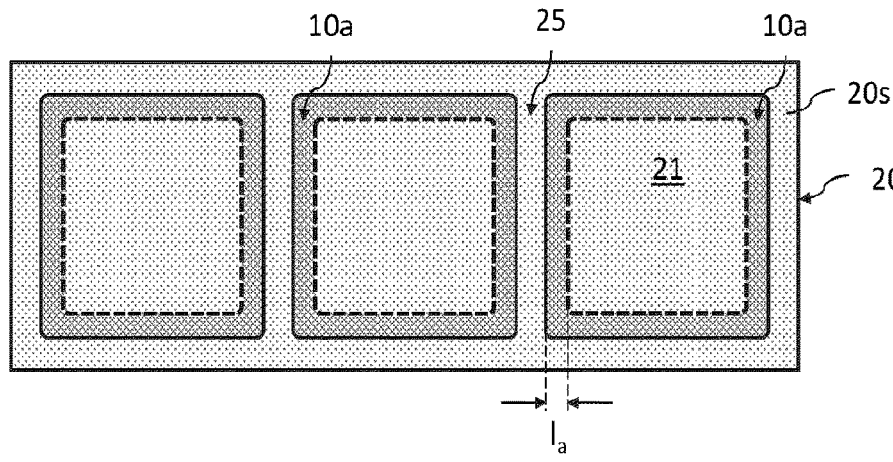

FIG. 1I illustrates the upper face 20$s$ of the shaping support 20 on which the optical components 10 have been affixed, highlighting the support area 10$a$ of these on the lateral walls 25. The support area has a non-zero support width $l_a$ equal to $(l_t-l_t)/2$.

Figure 1J:
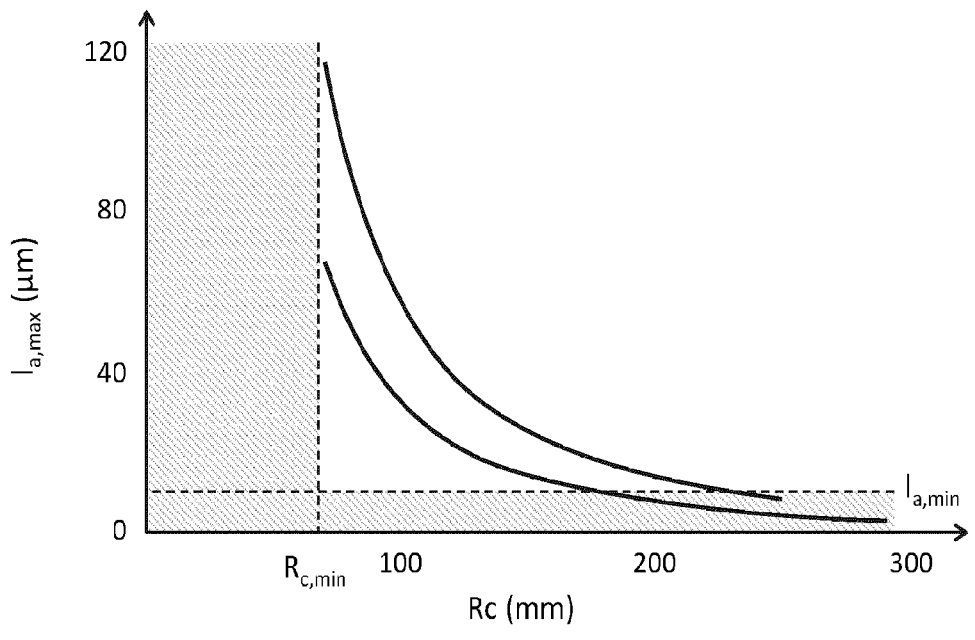

FIG. 1J illustrates an example of the evolution of the maximum support width $l_{a,max}$ of each optical component 10 on a lateral wall 25 as a function of the radius of curvature $R_c$ of the bent surface 21, for two examples of optical component 10. Indeed, the method may comprise a prior step of sizing the optical components 10 and the shaping support 20, so that the optical components 10 have a sufficient support width $l_a$ during the step of removing the handle substrate 7, while being able to be curved to come against bent surfaces 21.

These two examples correspond to optical components 10 with a square shape in the XY plane and with a side $l_{co}$ of 25 mm and 30 mm. The bent surfaces 21 are concave and square-shaped. The radius of curvature is constant, and takes on the same value along the X axis as along the Y axis. This geometric model allows deducing, from the width $l_{co}$ of the optical components 10 and the radius of curvature $R_c$ the maximum support width $l_{a,max}$ of the optical components 10 so that they could be curved according to the radius of curvature $R_c$ and come against the bent surfaces 21.

Moreover, it is considered that the support width $l_a$ will preferably be larger than or equal to a limit value $l_{a,min}$, herein equal to 10 µm, below which the support width $l_a$ will not be sufficient to ensure holding of the optical components 10. In addition, it is considered that the radius of curvature $R_c$ will be larger than or equal to a limit value $R_{c,min}$, for example herein equal to 70 mm, so as to avoid any degradation of the mechanical properties of the optical components 10 then curved and having the radius of curvature $R_c$.

Also, knowing the desired radius of curvature Rc and the transverse dimension la of the optical components 10, it is possible to determine a support width la comprised between a predefined minimum value la,min and a maximum value la,max determined from the geometric model, so that the optical components 10 rest sufficiently on the lateral walls 25, while being able to be curved afterwards according to the desired radius of curvature Rc without being structurally degraded.

Figure 1K:
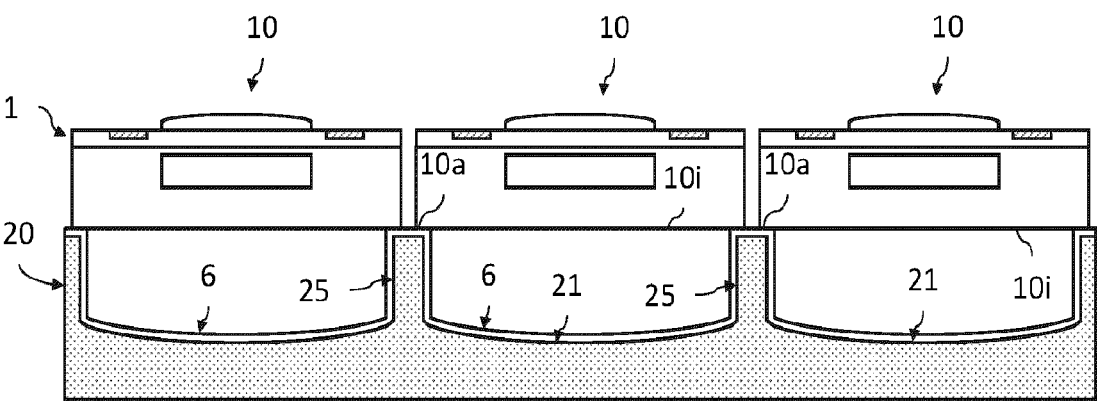
Figure 1K:
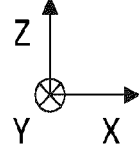

Referring to FIG. 1K, the handle substrate 7 is removed. For this purpose, before proceeding with the removal, it is advantageous to proceed with a first crosslinking of the adhesive interlayer 6. This is performed by bringing the structure to a first so-called partial crosslinking temperature $T_1$ within the crosslinking temperature range, herein comprised between 80° C. and 200° C. This first temperature $T_1$ is lower than a second so-called total crosslinking temperature $T_2$ applied when the optical components 10 are curved against the bent surfaces 21. Thus, the crosslinking, herein partial, of the adhesive interlayer 6 allows improving the assembly of the optical components 10 while enabling the subsequent bending thereof.

Figure 1L:
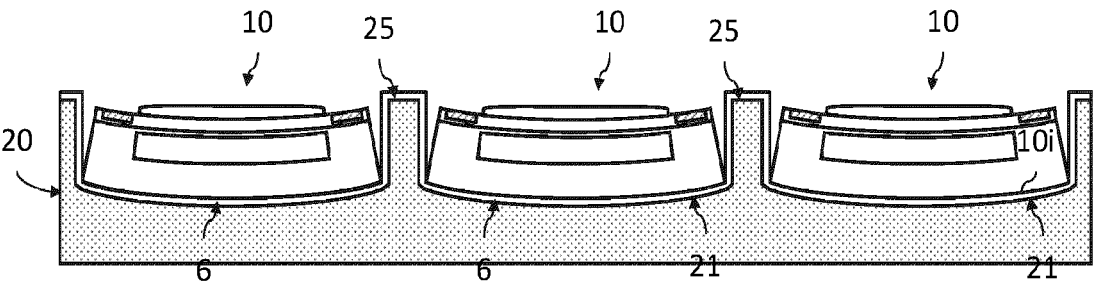

Referring to FIG. 1L, the collective bending of the optical components 10 is performed. Beforehand, it is advantageous to locally weaken the adhesive interlayer 6 at the support areas 10$a$, so as to reduce the mechanical stresses, in particular shear stresses, undergone by the adhesive interlayer 6 during bending of the optical components 10. For this purpose, a laser shot may be performed at the support area 10$a$, for example throughout the shaping support 20 or the trenches 9.

Afterwards, the optical components 10 are curved simultaneously, until their lower face 10$i$ comes against the corresponding bent surface 21, the adhesive interlayer 6 then being located between and in contact with the lower face 10$i$ and the bent surface 21. For this purpose, a pressure is applied to each of the optical components 10, for example by a press tool (not represented), simultaneously. Each optical component 10 deforms and assumes the curvature imposed by the corresponding bent surface 21. The optical components 10 then 'slip' along the upper face of the shaping support 20 until they come against the bent surfaces 21. This is possible to the extent that the materials of the adhesive layers which crosslink during a rise in temperature generally have a good mechanical resistance to "pulling" (which allows holding the optical components 10 during the removal of the handle substrate 7) and nonetheless allow undergoing shearing (which enables slipping of the optical components 10 during shaping thereof). Thus, a plurality of optical components 10 are obtained, all curved according to the desired curvature, assembled onto the same shaping support 20.

A rise in the temperature may also be performed during or after bending, at a second crosslinking temperature $T_2$ of the adhesive interlayer 6, this temperature $T_2$ being higher than the previous temperature $T_1$, allowing obtaining a more complete crosslinking. Thus, the assembly of the optical components 10 to the bent surfaces 21 is improved.

Figure 1M:
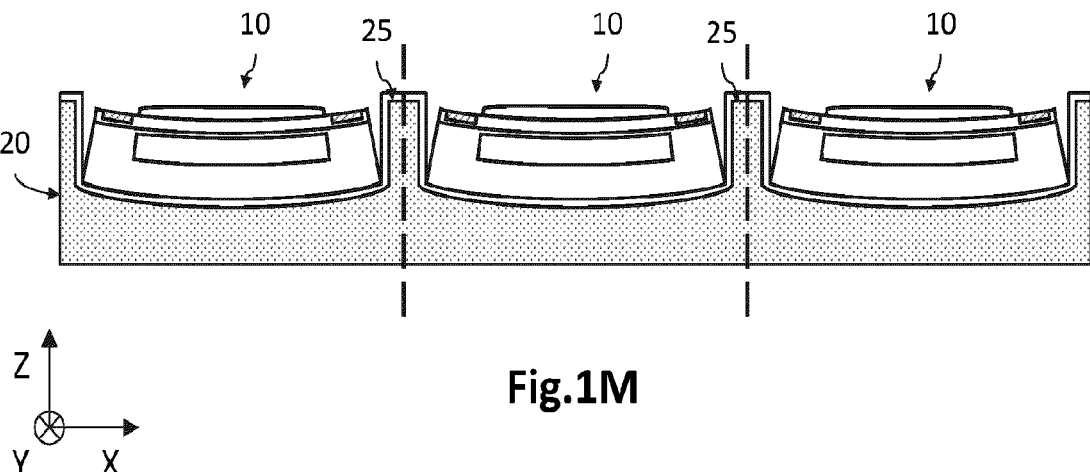

Referring to FIG. 1M, cutting of the obtained structure is performed, so as to individualise the optical components 10, according to the predefined cutting lines passing through the lateral walls 25. Thus, a plurality of optical components 10 are obtained, distinct from each other, each assembled to a portion of the shaping support 20. An electrical connection to an external electrical circuit (not represented) may be performed by wiring (wire bonding).

Thus, the collective bending method allows obtaining a plurality of optical components 10 curved and assembled to a portion of the same shaping support 20. To the extent that affixing the optical components 10 onto the shaping support 20 is performed by means of a handle substrate 7, and not by means of lower and upper support layers like in the aforementioned example of the prior art, the optical components 10 may actually have the desired curvature, defined by that of the bent surfaces 21. In addition, cross-linking the adhesive interlayer 6 in two steps advantageously allows removing the handle substrate 7 with a better adhesion of the optical components 10 to the shaping support 20, then enabling shaping of the optical components 10.

Figure 2A:
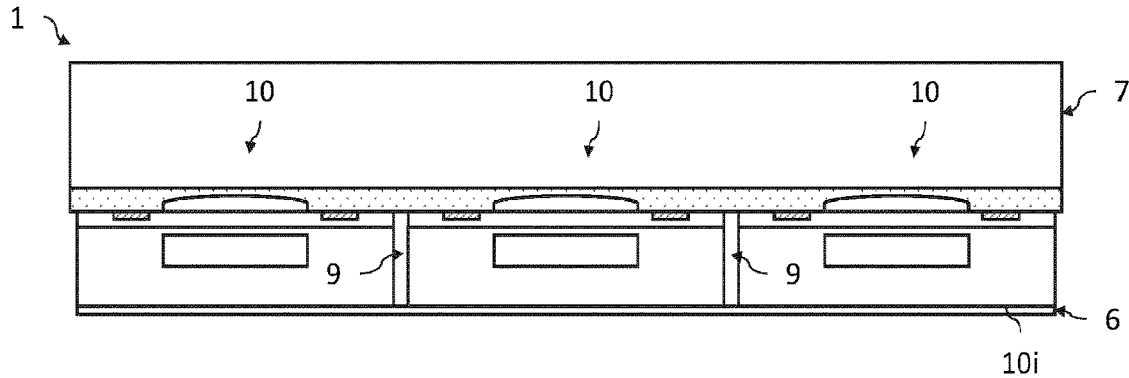
FIGS. 2A to 2C illustrate different steps of a variant of a method for collective shaping of microelectronic components, in the case where the adhesive interlayer is deposited over the lower face of the microelectronic components.
Figure 2B:
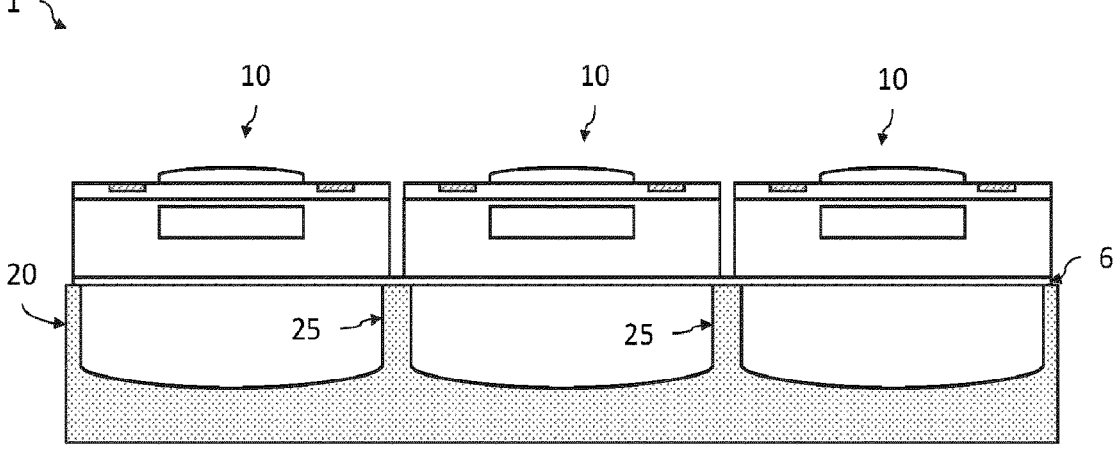
Figure 2C:
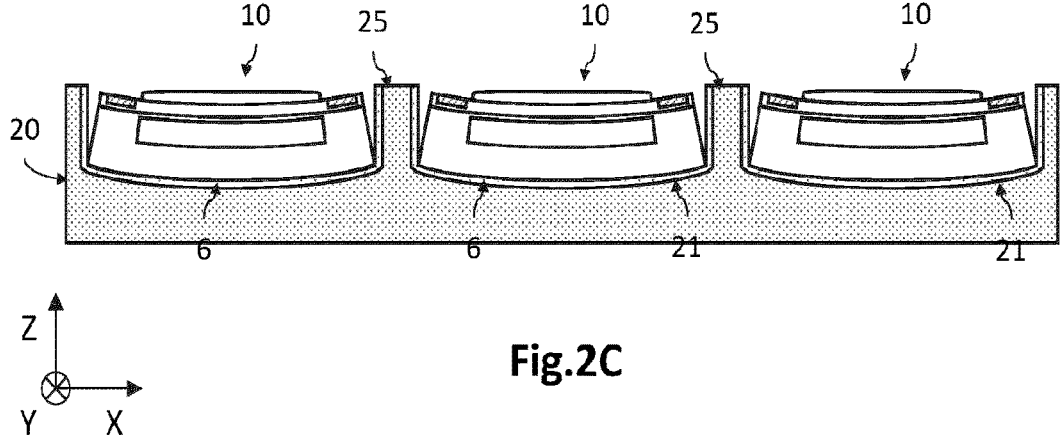

FIGS. 2A to 2C illustrate steps of a collective bending method according to one variant. This variant differs from the previously-described method essentially in that the adhesive interlayer 6 is initially deposited over the lower face 10i of the optical components 10, and not over the upper face 20s of the shaping support 20.

FIG. 2A illustrates a step of depositing the adhesive interlayer 6 over the lower face 10i of the optical components 10. The adhesive interlayer 6 has, at least over each of the lower faces 10i, a constant thickness, for example comprised between 5 μm and 100 μm.

FIG. 2B illustrates the step of affixing the optical components 10 onto the shaping support 20, so that they rest on the lateral walls 25 and adhere to these by the adhesive interlayer 6. This step is similar or identical to that illustrated in FIG. 1K.

FIG. 2C illustrates the step of collective shaping of the optical components 10. This step is similar or identical to the step previously-described (in FIG. 1L) and is not detailed herein again.

FIGS. 3A to 3I illustrate steps of a collective bending method according to another variant. This variant differs from what has been described before in that the electrical connection of the optical components 10 is made from the lower face 20i of the shaping support 20.

Figure 3A:
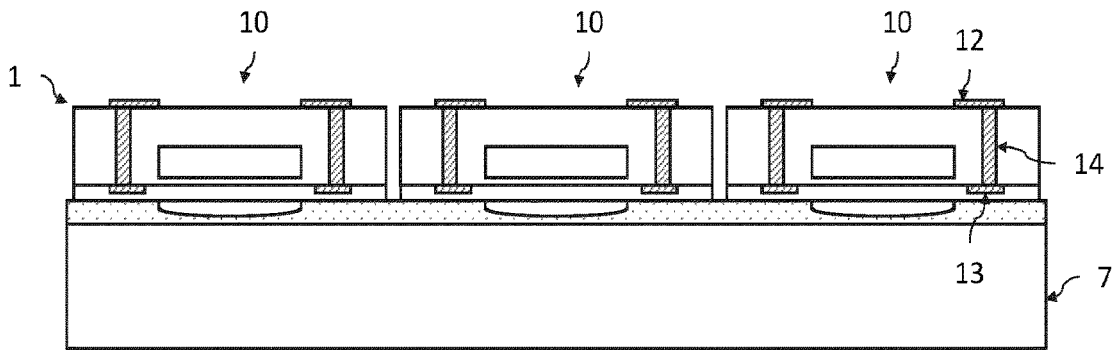
FIGS. 3A to 3I illustrate different steps of another variant of a method for collective shaping of microelectronic components, in the case where the shaping support ensures the electrical interconnection of the microelectronic components from its lower face.
Figure 3A:
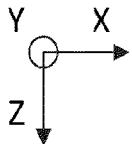

Referring to FIG. 3A, the structure obtained during step 1C or 2A is turned over, and conductive vias 14 (herein TSV, standing for Through Silicon Via) are made which extend throughout each optical component 10 and open onto the upper conductive pads 13. Afterwards, lower conductive pads 12 resting on the lower face 2 are made, which are connected to the conductive vias 14.

Figure 3B:
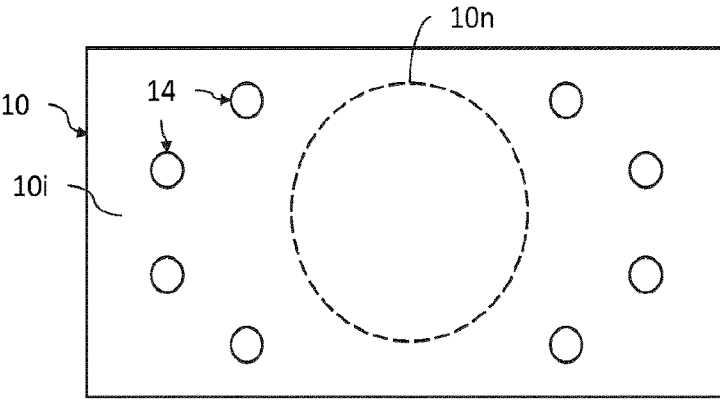
Figure 3C:
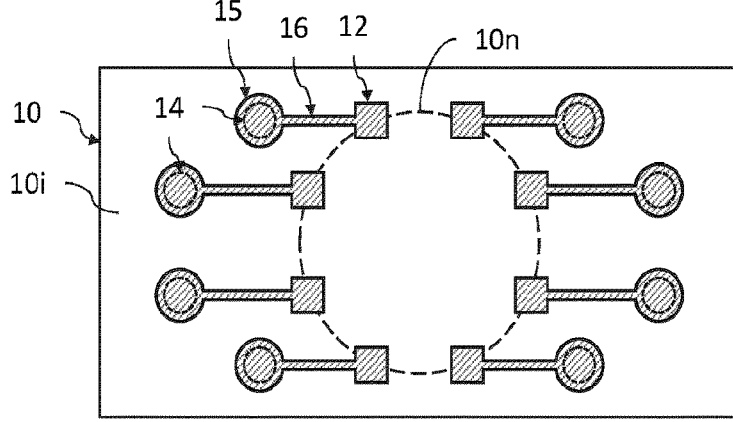
Figure 3C:
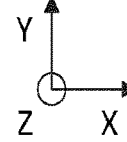

The lower conductive pads 12 are each connected to the conductive vias 14 herein via a conductive line 16 and an intermediate conductive pad 15 (cf. FIG. 3C). Also, the electrical connection of the lower conductive pads 12 allows connecting the photodiodes. Alternatively, the lower conductive pads 12 themselves may be in contact with the conductive vias 14.

As detailed in FIG. 3C, the lower conductive pads 12 are herein advantageously arranged along a level line 10n of the lower face 10i of each optical component 10. A level line 10n of the lower face 10i is defined as being, when the optical component 10 is assembled to the shaping support 20 and curved according to the curvature of the bent surface 21, a line equidistant from the lower face 20i of the shaping support 20.

Thus, FIG. 3B illustrates the lower face 10i of one of the optical components 10. There are represented the lower orifices of the conductive vias 14. They are herein arranged around and outside a level line (dotted line) of the optical component 10. This level line 10n has been predetermined according to the position and the curvature that the optical component 10 is intended to have when it will be assembled to the shaping support 20. In this example, the level line 10n is circular, but it could have another shape.

FIG. 3C illustrates the same lower face 10i of the optical component 10, over which the lower conductive pads 12, the conductive lines 16 and the intermediate conductive pads 15 have been made. The intermediate conductive pads 15 are located in contact with the conductive vias 14. The lower conductive pads 12 are located on the level line 10n. The conductive lines 16 connect the intermediate conductive pads 15 to the lower conductive pads 12.

The fact that the lower conductive pads 12 are advantageously located along the level line 10n allows making conductive vias 22 of the shaping support 20 after assembly of the optical component 10 to the shaping support 20, and not before this step, so that they all have a uniform vertical dimension, i.e. the same height, without risking degrading the optical components 10.

It should be noted that this arrangement of the intermediate conductive pads 15 and of the lower conductive pads 12 is given for illustration. Other arrangements are possible. Thus, the electrical interconnections may be devoid of conductive lines 16. Hence, the conductive vias 14 of the optical component 10 may open directly onto the lower conductive pads 12, which therefore extend so as to be at least partially located on the level line.

Figure 3D:
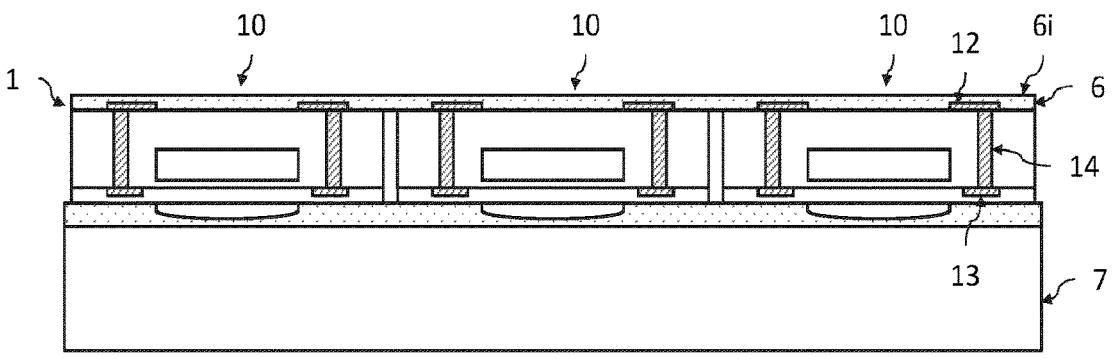

Referring to FIG. 3D, the adhesive interlayer 6 is deposited so as to entirely cover the lower face 2i as well as the lower conductive pads 12 (and herein the conductive lines 16 and the intermediate conductive pads 15). It has a lower face 6i, planar, free (i.e. not coated with another material) and continuous. The lower face 6i is so-called continuous in the sense that it is not crossed by either one of the conductive pads 12, 15 (only the reference 12 is indicated). Hence, the conductive pads 12, 15 do not project out of this adhesive interlayer 6. From a more formal perspective, one could define a continuous face by the fact that any two points of this face are connected together by a segment all points of which belong to the considered face.

Figure 3E:
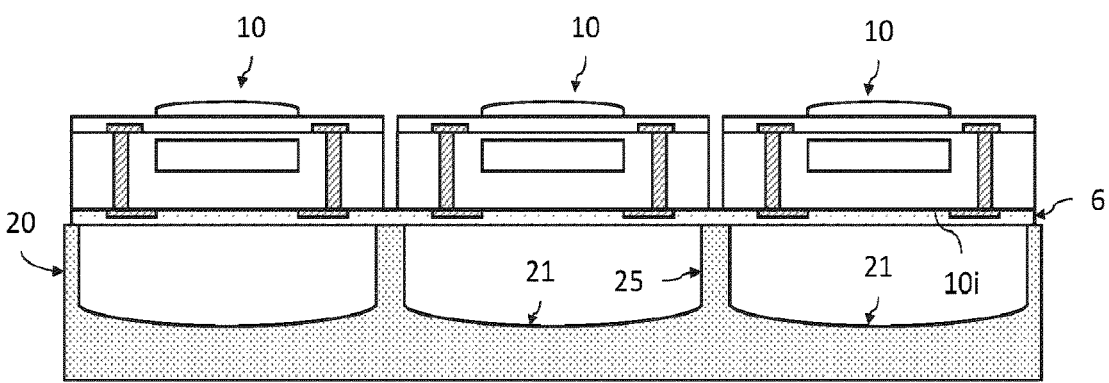

Referring to FIG. 3E, affixing the optical components 10 on the shaping support 20 is performed, so that they rest on the lateral walls 25 and adhere to these by the adhesive interlayer 6. This step is similar or identical to that illustrated in FIG. 1K and in FIG. 2B. The handle substrate 7 is removed without detaching the optical components 10 off the shaping support 20, since these adhere to the lateral walls 25 by the adhesive interlayer 6.

Figure 3F:
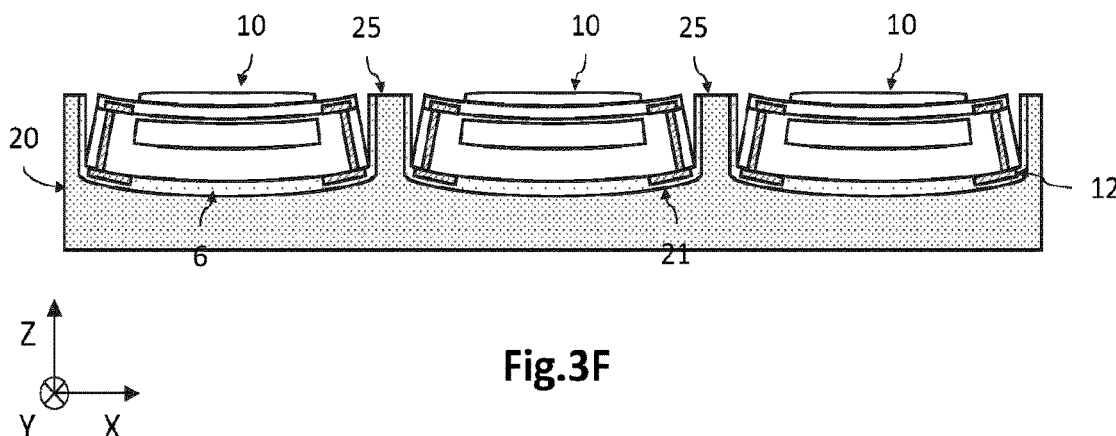

Referring to FIG. 3F, the collective shaping of the optical components 10 is performed. This step is similar or identical to the step described in FIG. 1L and in FIG. 2C. The adhesive interlayer 6 is herein in contact with the entire bent surface 21, and the conductive pads 12, 15 are not in contact with this bent surface 21. Hence, the adhesive interlayer 6 is not crossed by the lower 12 and intermediate 15 conductive pads which would project. Shaping is not then disturbed by such projecting studs, so that the optical components 10 could then have a curvature which is the desired curvature (that of the bent surfaces 21).

Figure 3G:
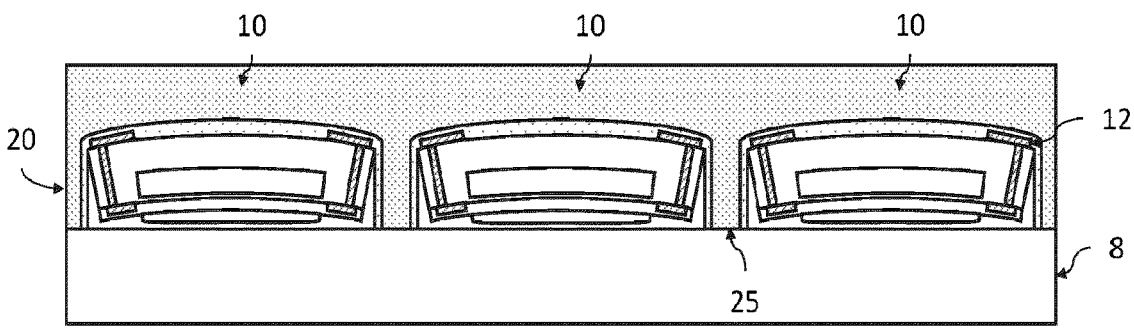
Figure 3G:
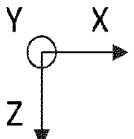

Referring to FIG. 3G, a handle substrate 8 is assembled to the stack thus obtained, allowing handling it during the step of making the electrical interconnections in the shaping support 20. For this purpose, the handle substrate 8 is assembled to the lateral walls 25. A layer of glue (not represented) may be used in this step. The handle substrate 8 may be a temporary handle (for example made of silicon), in particular when it is not transparent to the light radiation of interest, or may be a permanent handle (for example made of glass) and serve as a protective transparent cover opposite each optical component 10.

Figure 3H:
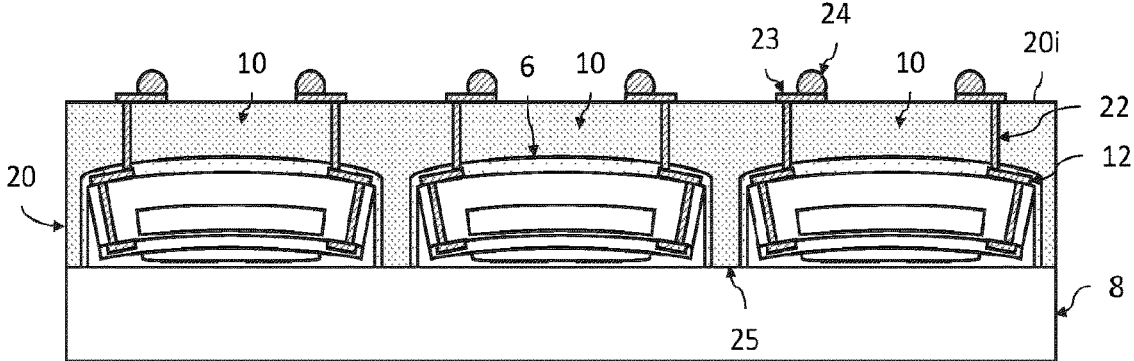

Referring to FIG. 3H, conductive vias 22 are made which extend throughout the shaping support 20 and the adhesive interlayer 6, from the lower face 20*i*, until opening directly onto the lower conductive pads 12. For this purpose, the open-through holes are made simultaneously so that they all have the same height. To the extent that they open onto the lower conductive pads 12, which are located on the level lines of the lower faces 10*i* then curved according to the curvature imposed by that of the bent surfaces 21, there is no risk that making of the open-through holes does not degrade the optical components 10. Afterwards, the conductive vias 22 are made by at least partially filling the open-through holes with an electrically-conductive material.

The electrical interconnections of the shaping support 20 may also include, as illustrated in this example, conductive lines 23 extending over the lower face 20*i*. It is also possible to make elements 24 for connection to an external electrical circuit (not represented), for example located in a printed circuit board PCB. These herein consist of beads made of a fusible material such as indium or an SnAg-based alloy.

Figure 3I:
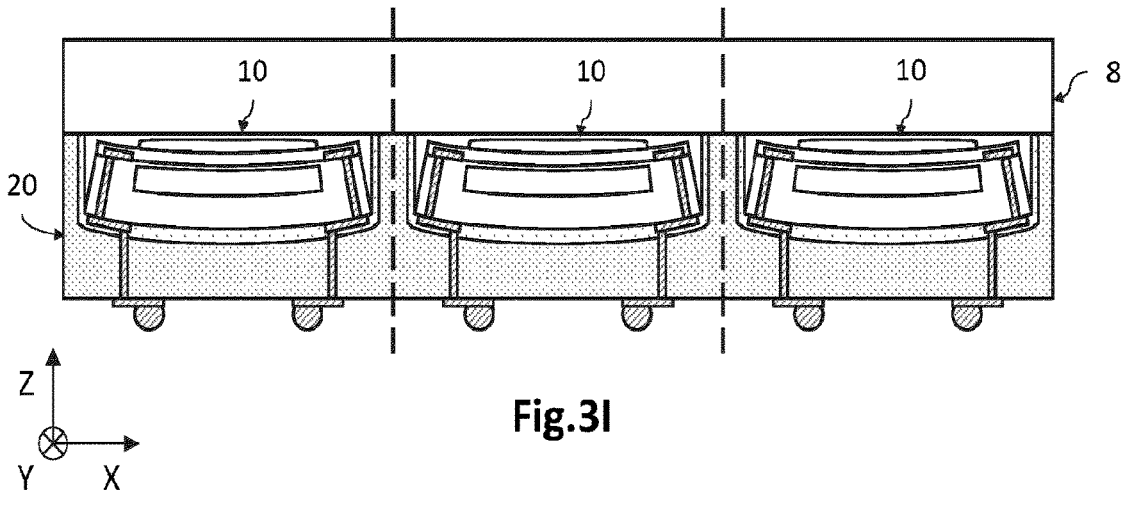

Referring to FIG. 3I, the structure thus obtained is cut to individualise the optical components 10. In this example, the handle substrate 8 forms a permanent cover to the extent that it is made of a material transparent to the light radiation of interest. Alternatively, it may be removed, before or after this cutting operation. A transparent cover may be assembled, or not, to the different optical components 10.

Thus, the collective bending method allows obtaining a plurality of optical components 10 curved and assembled to a portion of the same shaping and electrical interconnection support 20. To the extent that the adhesive interlayer 6 has a planar and continuous lower face 6*i* (therefore without the conductive pads 12, 15 projecting), the optical components 10 could actually have the desired curvature. In addition, the conductive vias 22 are made after bending and assembly, and advantageously have the same height. To ensure a good electrical connection without any risk of degrading the optical components, they open onto the lower conductive pads 12, which are then advantageously located on a level line of the curved lower face 10*i* of the optical components 10.

Particular embodiments have just been described. Various variations and modifications will appear to a person skilled in the art.

Thus, the optical components 10 have a BSI configuration. The initial structure 1 is similar to that previously described with reference to FIG. 1A, and differs therefrom in that the interconnection layer (BEOL) is flush with the lower face 2*i* and not the upper face 2*s* of the optical substrate 2. Also, the initial structure 1 herein includes, for each optical component 10, lower conductive pads 12 (ensuring connection to the array of photodiodes via the interconnection layer). These lower conductive pads 12 may be connected to the conductive vias 22 of the shaping support 20 (as illustrated in FIG. 3A to 3I), or be connected to connection wires via upper conductive pads 13 and conductive vias 14 passing through the optical substrate 2 (as illustrated in FIG. 1A to 1M).

Moreover, in the case of the variants of FIG. 2A to 2C and of FIG. 3A to 3I, the shaping support 20 may include open-through holes extending throughout the shaping support 20, from the lower face 20*i* up to the bent surfaces 21, and located for example at the centre of these. Also, these open-through holes may be put to use when bending the optical components 10. For this purpose, the gas located in the space delimited by the lower face 6*i* of the adhesive interlayer 6 and of the bent surface 21 is sucked in to assist in bending the optical components 10.

The invention claimed is:

1. A method for collective bending of microelectronic components, including the following steps:

making an initial structure, including:

a plurality of microelectronic components, having an upper face and an opposite lower face, spaced laterally apart from each other by a non-zero distance $l_t$;

a same temporary handle substrate, made of a rigid material, which extends continuously opposite the microelectronic components, and to which all microelectronic components are assembled by their upper face;

providing a shaping support, having an upper face and an opposite lower face, the upper face including a plurality of bent surfaces surrounded by lateral walls;

depositing an adhesive interlayer covering the lower face of the microelectronic components or the upper face of the shaping support;

affixing the initial structure onto the shaping support, so that the microelectronic components rest and adhere at a support area of their lower face over an upper surface of the lateral walls;

removing the temporarily handle substrate;

bending the microelectronic components, so that they are curved, and adhere over the bent surfaces by the adhesive interlayer, the latter then being in contact with the lower face of each microelectronic component and of the corresponding bent surface;

dicing the assembly thus obtained, so as to individualize the microelectronic components, each then being assembled to a portion of the shaping support.

2. The method according to claim 1, wherein the step of making the initial structure includes the following steps:

making a microelectronic substrate, having an upper face and an opposite lower face, including the plurality of microelectronic components, making trenches in the microelectronic substrate, from its upper face, surrounding the microelectronic components, and having a width equal to the distance assembling the microelectronic substrate by its upper face to the temporary handle substrate to which all microelectronic components are assembled;

thinning the microelectronic substrate from its lower face, until making the trenches open-through.

3. The method according to claim 1, including, before the removal step, a temperature rise to a first temperature within a crosslinking temperature range of the adhesive interlayer, then, during or after the bending step, a temperature rise to a second temperature within the crosslinking temperature range and higher than the first temperature.

4. The method according to claim 2, including a prior step of determining a width la of the support area, comprised between a predefined minimum value $l_{a,min}$ and a predetermined maximum value $l_{a,max}$, the latter depending on a radius of curvature $R_c$ and lateral dimensions $l_{sc}$ of the bent surfaces, and lateral dimensions $l_{co}$ of the microelectronic components before bending.

5. The method according to claim 1, the lower face of the microelectronic components being, before the deposition of the adhesive interlayer, a free face, the adhesive interlayer being deposited so as to have a constant thickness over the lower face of the microelectronic components or over the upper face of the shaping support.

6. The method according to claim 1, wherein, before the step of removing the temporary handle substrate to which all microelectronic components are assembled, lower conductive pads are made over the lower face of the microelectronic components, adapted to ensure the electrical connection of the microelectronic components, and disposed over a level line of a lower face of the corresponding microelectronic component, the line level being predetermined as being a line equidistant from the lower face of the shaping support, when the microelectronic component is assembled to the shaping support and is curved according to the curvature of the bent surface.

7. The method according to claim 6, wherein, before the step of removing the temporary handle substrate to which all microelectronic components are assembled, upper conductive pads are made over the upper face of the microelectronic components, and conductive vias extending from the lower face of the microelectronic components and opening onto the upper conductive pads, the lower conductive pads being connected to the conductive vias of the microelectronic components.

8. The method according to claim 6, wherein, after the bending step, a handle substrate is assembled to the lateral walls of the shaping support, so as to enable handling of the stack thus obtained during a step of making the conductive vias in the shaping support.

9. The method according to claim 8, wherein, after the bending step, the conductive vias extending throughout the shaping support and the adhesive interlayer are made, from the lower face of the shaping support to open onto the lower conductive pads, the conductive vias having a uniform vertical dimension.

10. The method according to claim 6, wherein the lower conductive pads are disposed in contact with the conductive vias of the microelectronic components, or are offset with respect to these conductive vias and are connected by conductive lines.

11. The method according to claim 6, wherein the adhesive interlayer completely covers the lower face of the microelectronic components as well as the lower conductive pads, and has a free, planar and continuous lower face.

12. The method according to claim 1, wherein the shaping substrate is made into a one-piece block and in the same material.

13. The method according to claim 1, wherein the shaping substrate is made of a heat-conductive material.

14. The method according to claim 1, wherein the microelectronic components are optical components for emitting or detecting a light radiation.

\* \* \* \* \*